United States Patent [19]

Mehnert

[11] Patent Number: 5,018,049
[45] Date of Patent: May 21, 1991

[54] HOUSING FOR ELECTRONIC SWITCHGEAR

[75] Inventor: Wolfgang Mehnert, Lindau-Reutin, Fed. Rep. of Germany

[73] Assignee: IFM Electronic GmbH, Essen, Fed. Rep. of Germany

[21] Appl. No.: 355,019

[22] Filed: May 22, 1989

[30] Foreign Application Priority Data

May 31, 1988 [DE] Fed. Rep. of Germany ....... 3818499

[51] Int. Cl.⁵ .......................... H05K 7/20; H01F 27/00
[52] U.S. Cl. .................................. 361/380; 174/52.1; 336/90
[58] Field of Search ................ 361/179, 180, 181, 331, 361/380, 395, 399, 419, 142; 331/65; 307/116; 200/82 R, 82 E, 52 R, 302.1; 174/52.1–52.3; 336/90

[56] References Cited

U.S. PATENT DOCUMENTS 4,225,748  9/1980  Buck et al. ................. 361/331 X
4,419,646 12/1983  Hermle ......................... 361/380
4,785,240 11/1988  Newell et al. ................. 361/180

FOREIGN PATENT DOCUMENTS 3029595 10/1981 Fed. Rep. of Germany .

Primary Examiner—J. R. Scott
Attorney, Agent, or Firm—Browdy and Neimark

[57] ABSTRACT

A housing for electronic switchgear comprises an outer sleeve made of metal, an inner sleeve positioned within the outer sleeve and being made of electrically insulating plastic that is impermeable to water, dust and other media in the ambient atmosphere, and a stopper of similar plastic. The inner sleeve is closed at one end and the stopper is inserted into the sleeve at its other end to sealingly close the sleeve. The inner sleeve consists of a first sleeve part open at both ends and a second sleeve part aligned with the first sleeve part and closed at one end. The other end of the second sleeve part is abutting upon one end of the first sleeve part. The stopper is sealingly inserted into the first sleeve part at its other end. The plastic of the first sleeve part is transparent or translucent whereas the plastic of said second sleeve part is not transparent or translucent, but otherwise identical or of equal grade. Both sleeve parts are bonded together with their abutting ends in a hermetically sealed and puncture-proof manner, in particular, by ultrasonic plastics welding. Preferably the first sleeve part is an extruded part, whereas the second sleeve part is an injection molded part.

24 Claims, 2 Drawing Sheets

HOUSING FOR ELECTRONIC SWITCHGEAR

BACKGROUND OF THE INVENTION

1. Field of the invention

The invention relates to a housing for electronic switchgear, in particular a housing for a proximity switch or the like.

2. The Prior Art

Electronic switchgear is known in many forms, in particular in the form of inductive, capacitive and optoelectronic proximity switches. With the aid of the metal sleeve provided with a male thread, the housing of such switchgear can be threaded into dimensionally defined threaded sockets at the site where it is to be used. The inside diameter available for accommodating the circuitry is determined by the fixedly defined outside diameter and by the wall thickness of the inner and outer sleeves. With a small outside diameter, e.g. 18 mm or less, a very small wall thickness must be provided for the inner sleeve, that is, a wall thickness of less than 0.5 mm. and preferably of approximately 0.4 mm. This requirement, however, conflicts with increasingly stringent requirements for tightness and dielectric strength of such housing. Up to now meeting these requirements generally requires potting the circuitry with insulating resin.

A particular problem arises if an optical switching state indicator that is intended to be visible from outside the outer sleeve is provided for on the circuitry positioned inside the inner sleeve. With this need in view, many attempts have been made to meet standard requirements for tightness and dielectric strength see West German Patent 30 29 595 and the prior art discussed therein. Among these known attempts at solving the problem, those that have at least made sense in principle nevertheless have proved impossible to reduce to practice, given the slight wall thickness needed.

With a wall thickness of no more than 0.5 mm. as explained above, the prior art housing with a one-piece, injection-molded inner sleeve has a maximum length of about 40 mm. For technical reasons associated with the injection molding process a greater length is impossible to obtain.

OBJECT OF THE INVENTION

The object of the present invention is to improve the housing for electronic switchgear in such a way that in view of necessary small wall thickness of the inner sleeve it still meets stringent requirements in terms of tightness and dielectric strength.

SUMMARY OF THE INVENTION

The housing for electronic switchgear meeting above giving object comprises an outer sleeve made of metal, an inner sleeve positioned within said outer sleeve and being made of electrically insulating plastics that is impermeable to water, dust and other media in the ambient atmosphere, and a stopper of electrically insulating plastics that is impermeable to water, dust and other media in the ambient atmosphere, wherein said inner sleeve is as such closed at one end and said stopper is inserted into said inner sleeve at its other end and is sealingly connected to said inner sleeve in order to close said inner sleeve, wherein said inner sleeve consists of a first sleeve part open at both ends and a second sleeve part aligned which said first sleeve part and closed at one end, its other end abutting upon one end of said first sleeve part, said stopper being sealingly inserted into said first sleeve part at its other end, wherein the plastics of said first sleeve part is transparent or translucent, whereas the plastics of said second sleeve part is not transparent or translucent but otherwise identical or of equal grade with the plastics of said first sleeve part, wherein said first sleeve part and said second sleeve part are bonded together with their abutting ends in a hermetically sealed and puncture-proof manner, and wherein said stopper is formed as a cable duct to sealingly pass through a cable.

As a result, both the inner sleeve and the outer sleeve of metal can be made in virtually any arbitrary length, even with the small wall thickness needed. This is possible, because the first sleeve part as the outer sleeve is open at both ends and can be produced in any desired length. In contrast, the second sleeve part being closed at one end, the length of which is confined by the technical reasons explained above, does not need a major length.

In particular, the first sleeve part can be made as an extruded part, whereas the second sleeve part can be made as an injection molded part.

Polysulfone is a plastics material specifically adapted to the requirements of this application. Polysulfone may be used for the first sleeve part as well as for the second sleeve part and the stopper.

The bonding of both sleeve parts of the inner sleeve at their abutting ends in a hermetically sealed and puncture-proof manner may be made using compatible adhesives. Nevertheless, a preferable bonding technique without using adhesives at all is ultrasonic plastics welding. Provided that suitable plastics is used, ultrasonic plastics welding leads to a perfect durable bond between the two sleeve parts so that those parts are forming a continuous inner sleeve with no weak points in terms of either sealing or insulation in the bonding region. This bonding technique of ultrasonic plastics welding may well be applied for bonding the stopper to the first sleeve part as well. To this end the stopper could be provided with contact faces on its outside so that an ultrasonic vibration device could abut those contact faces to introduce ultrasonic vibration into said stopper.

There are many possible ways of embodying and developing the invention. Reference can be made primarily to the claims. The invention is further illustrated by the ensuing detailed description of two preferred embodiments of electronic switchgear according to the invention, taken in conjunction with the drawings.

DESCRIPTION OF THE PREFERRED EMBODIMENTS

Figure 1:
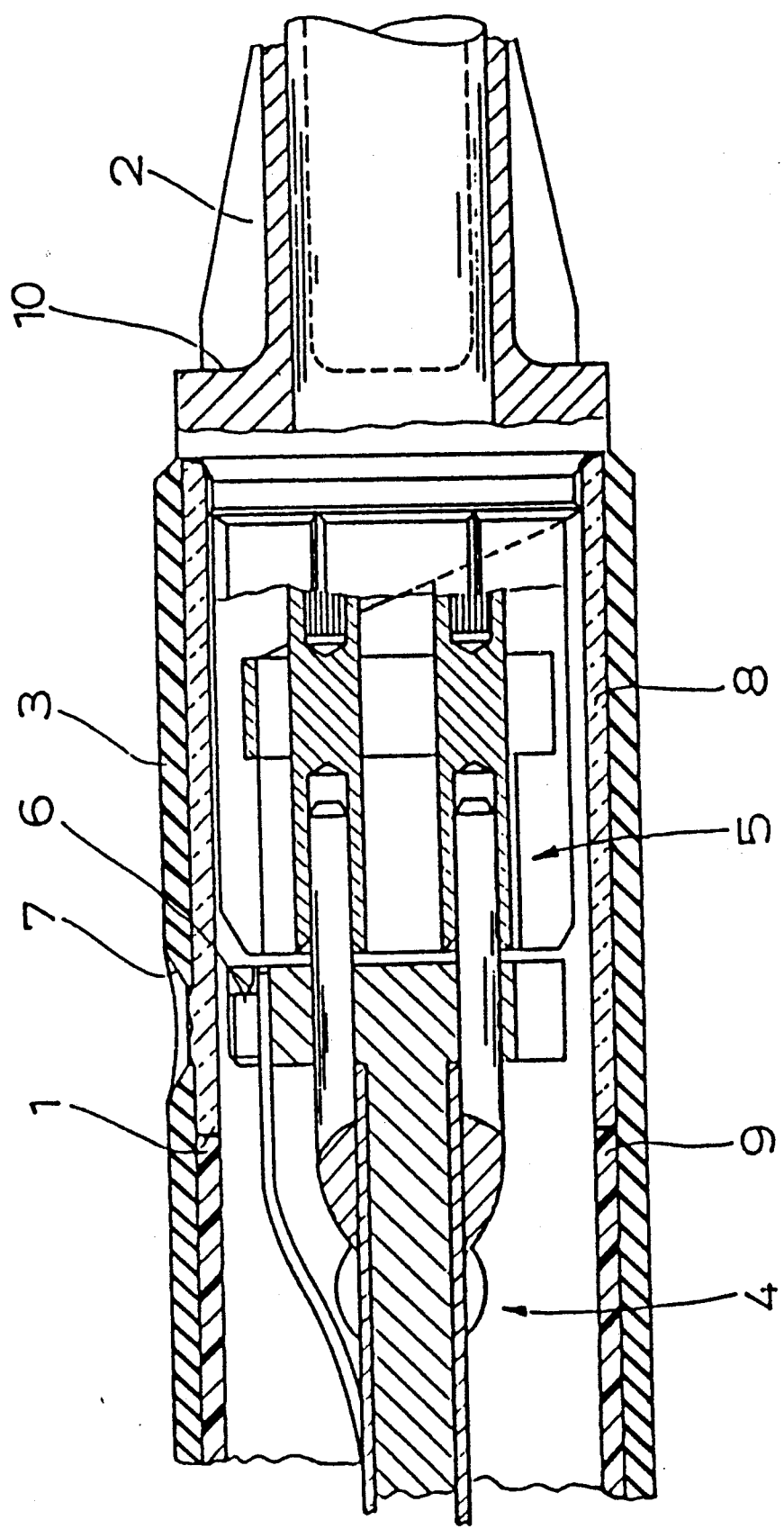
FIG. 1 is view of a first exemplary embodiment of a housing for electronic switchgear according to the invention.

The housing shown in section in FIG. 1, is provided for electronic switchgear in the form of a proximity switch. The housing has an inner sleeve 1, closed at one end (the end not shown in FIG. 1), a stopper 2 closing the inner sleeve 1 at its open end, and an outer sleeve 3 surrounding the inner sleeve 1. More specifically, the inner sleeve 1 is of electrically insulating plastics impermeable to water, dust and other media in the ambient atmosphere. The inner sleeve 1 is puncture-proof and forms a hermetically sealed cover for the circuitry positioned within. The stopper 2 is of equally electrically insulating plastics impermeable to water, dust and other media in the ambient atmosphere and is inserted into the inner sleeve 1 at its other end and is sealingly connected to the inner sleeve 1 in order to close the inner sleeve 1 at the remaining open side. The outer sleeve 3 is open at both ends and is made of metal.

Located within the inner sleeve 1 is a typical circuitry arrangement 4 for electronic switchgear, in particular for a proximity switch, here shown as a printed wiring board with a suitable electrical connector 5.

In the preferred embodiment shown in FIG. 1 a light emitting diode is part of the circuitry arrangement 4 and is used as an optical switching status indicator 6. The switchIng status indicator 6 emits light in one switching position of the switchgear or changes color if the switching status of the switchgear changes. The switching status indicator 6 is located directly on the inner wall of the inner sleeve 1 and is visible from outside the outer sleeve 3 through an observation hole 7 in the outer sleeve 3.

Now, the inner sleeve 1 consists of two sleeve parts 8, 9, i.e. a first sleeve part 8 open at both ends and a second sleeve part 9 closed as such at one end. The second sleeve part 9 is aligned with the first sleeve part 8. The open end of the second sleeve part 9 is abutting upon one end of the first sleeve part 8. The plastics of the first sleeve part 8 is transparent or translucent whereas the plastics of the second sleeve part 9 is not transparent or translucent but otherwise identical or of equal grade with the plastics of the first sleeve part 8. In particular the plastics of the second sleeve part 9 is tinted.

The first sleeve part 8 and the second sleeve part 9 are bonded together with their abutting ends in a hermetically sealed and puncture-proof manner. This is in the preferred embodiment done by ultrasonic plastics welding. This bonding technique is particularly well suited to the present application, because it results in an intimate bond of the plastics material of both sleeve parts 8, 9. By this bonding technique the initially separate sleeve parts 8, 9 of the inner sleeve 1 are transformed into a one-piece inner sleeve 1 as far as sealing and insulation and dielectric strength in the bonding region is concerned. Despite the necessary small wall thickness of both parts 8, 9 of the inner sleeve 1 a dielectric strength of 5 kV may be obtained using polysulfone for the inner sleeve 1 without the necessity to pot the circuitry arrangement 4 within the inner sleeve 1 with epoxy resin.

Polysulfone has been obtained as a particularly plastics especially in view of the ultrasonic plastics welding process that is preferable bonding technique. Polysulfone is also available on the market by the name of polyether sulfone, polyaryl sulfone, or polyphenyl sulfone.

In the exemplary embodiments shown, the first sleeve part 8 is an extruded part and the second sleeve part 9 is an injection molded part. Embodying the first sleeve part 8 as an extruded part has the advantage that the first sleeve part 8 can be produced with a virtually arbitrary length even with a very small wall thickness, for instance a wall thickness of approximately 0.4 mm.

The selected material described above as preferable for the inner sleeve 1 is equally suitable for the stopper 2 of the electronic switchgear according to the invention. The stopper 2 is also suitable for introducing the energy required for the ultrasonic plastics welding into the stopper 2 and inner sleeve 1. To this end the stopper 2 seen in FIG. 1 has contact faces 10 on its outside for an ultrasonic vibration device, not shown.

Figure 2:
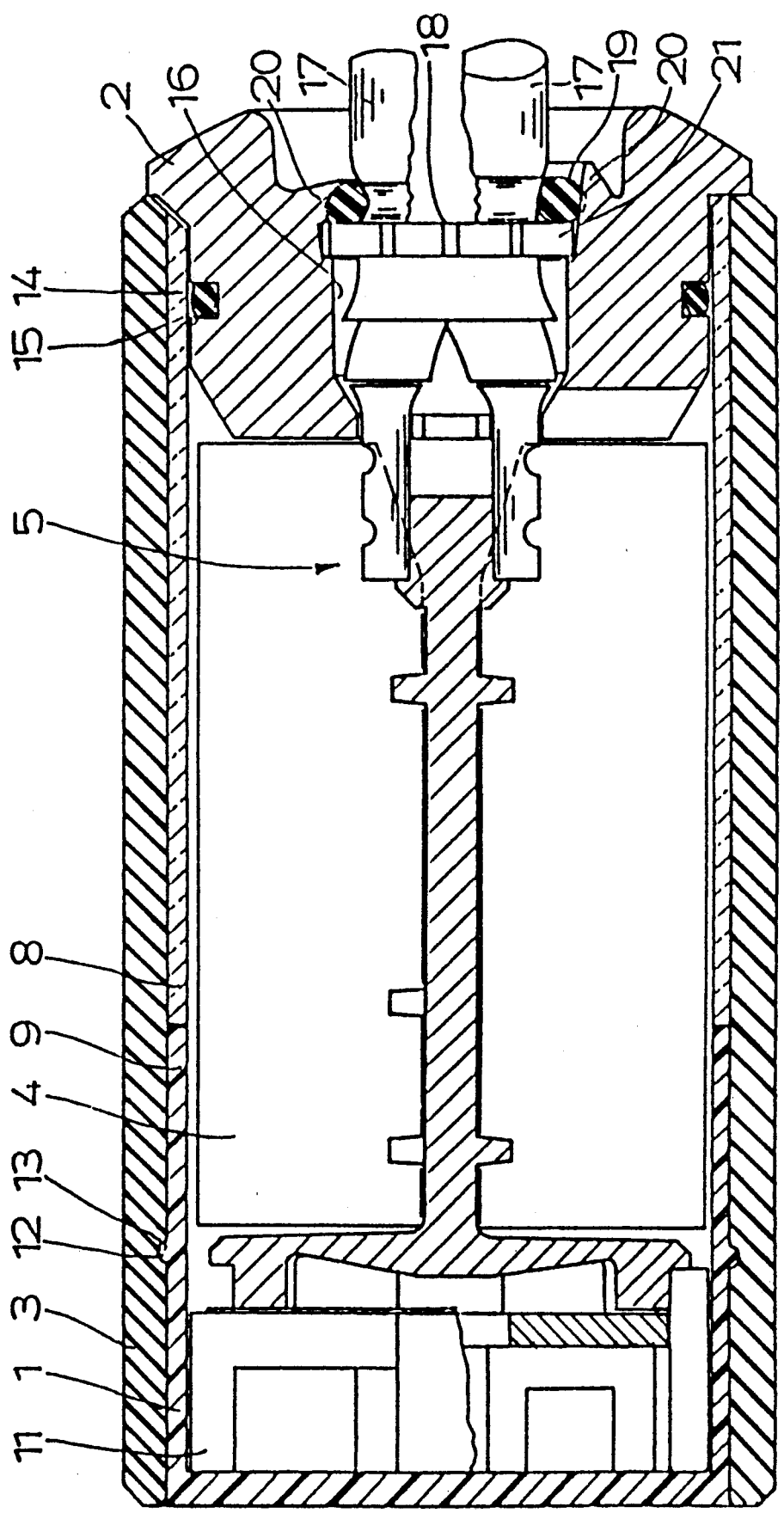
FIG. 2 is also a sectional view, showing a second exemplary embodiment of a housing for an electronic switchgear according to the invention.

The likewise preferred exemplary embodiment of a housing according to the invention shown in FIG. 2 has many features in common with the exemplary embodiment shown in FIG. 1. A distinction that is apparent here, however, is the closed end of the inner sleeve 1 and behind it the coil 11 of the proximity switch; in other words, an inductive proximity switch is shown here. Also visible on the inner sleeve 1 is an encompassing annular bead 12. which in combination with a corresponding annular groove 13 on the inside of the metal outer sleeve 3 defines the relative position of inner sleeve 1 and outer sleeve 3.

In the exemplary embodiment of FIG. 2, the stopper 2 is constructed different from the stopper 2 in FIG. 1. Here we have a housing wherein said stopper 2 has a receiving groove 14 in its outside, an O-ring 15 is positioned within said receiving groove 14, and said O-ring 15 is sealingly contacting said first sleeve part 8 to seal off saId stopper 2 from said first sleeve part 8. Here the connection of the stopper 2 and the inner sleeve 1 is not made by ultrasonic plastics welding but is effected by a press fit with the aid of O-ring 15.

Moreover, in the exemplary embodiment of FIG 2, a housing is provided wherein said stopper 2 has a central duct 16 with a cable 17 positioned therein, an O-ring 19 is positioned surrounding said cable 17 within said duct 16, said stopper 2 within said duct 16 having an encompassing bearing 18 for saId O-ring 19 and an annular protrusion 20 on the outside of said O-ring 19, and wherein said annular protrusion 20 is permanently deformed toward said cable 17 thereby pressing the O-ring 19 against said cable 17 for sealing said cable 17 within said duct 16. The bearing flange 18 is embodied on a support ring 21 inserted into the duct 16 of the stopper 2. Moreover FIG. 2 shows the different status of the annular protrusion 20 during deformation. In FIG. 2, lower part, annular protrusion 20 is not yet bent toward the cable 17, whereas in FIG. 2, upper part, annular protrusion 20 is bent toward the cable 17 by a permanent deformation of the plastics material of the stopper 2, this deformation being effected at high temperature. It can be seen how the O-ring 19 is sealingly pressed against the cable 17 within the duct 16.

What is claimed is:

1. A housing for electronic switchgear comprising:
    an outer sleeve made of metal,
    an inner sleeve positioned within said outer sleeve and being made of electrically insulating plastics that is impermeable to water, dust and other media in the ambient atmosphere,
    a stopper of electrically insulating plastics that is impermeable to water, dust and other media in the ambient atmosphere,
    wherein said inner sleeve is closed at one end and said stopper is inserted into said inner sleeve at its other end and is sealingly connected to said inner sleeve in order to close said inner sleeve,
    wherein said inner sleeve consists of a first sleeve part open at both ends and a second sleeve part aligned with the first sleeve part and closed at one end, its other end abutting upon one end of said first sleeve part, said stopper being sealingly inserted into said first sleeve part at its other end, wherein the plastics of said first sleeve part is transparent or translucent, whereas the plastics of said second sleeve part is not transparent or translucent but otherwise identical or of equal grade with the plastics of said first sleeve part, wherein said first sleeve part and said second sleeve part are bonded together with their abutting ends in a hermetically sealed and puncture-proof manner, and wherein said stopper is formed as a cable duct to sealingly pass through a cable.

2. A housing according to claim 1, wherein said first sleeve part is an extruded part, whereas said second sleeve part is an injection molded part.

3. A housing according to claim 1, wherein said first sleeve part is made of polysulfone.

4. A housing according to claim 1, wherein said second sleeve part is made of polysulfone.

5. A housing according to claim 1, wherein said stopper is made of polysulfone.

6. A housing according to claim 1, wherein said first sleeve part and said second sleeve part are bonded together by ultrasonic plastics welding.

7. A housing according to claim 6, wherein said stopper is joined to said first sleeve part by ultrasonic plastics welding.

8. A housing according to claim 7, wherein said stopper on its outside is formed with flat contact faces.

9. A housing according to claim 1, wherein a receiving groove is provided on the outside of said stopper, an O-ring is positioned within said receiving groove, and said O-ring is sealingly contacting said first sleeve part to seal off said stopper from said first sleeve part.

10. A housing according to claim 1, wherein said stopper has a central duct with a cable positioned therein, an O-ring is positioned surrounding said cable within said duct, said stopper within said duct having an encompassing bearing for said O-ring and an annular protrusion on the outside of said O-ring and wherein said annular protrusion is permanently deformed towards said cable thereby pressing the O-ring against said cable for sealing said cable with said duct.

11. A housing according to claim 10, wherein said bearing flange is embodied on a support ring inserted into said duct of said stopper.

12. A housing according to claim 1, wherein in the area of said first sleeve part made of transparent or translucent plastics an observation hole is provided in said outer sleeve of metal.

13. A housing for electronic switchgear comprising:
an outer sleeve made of metal,
an inner sleeve positioned within said outer sleeve and being made of electrically insulating plastics that is impermeable to water, dust and other media in the ambient atmosphere,
a stopper of electrically insulating plastics that is impermeable to water, dust sand other media in the ambient atmosphere,
wherein said inner sleeve is closed at one end and said stopper is inserted into said inner sleeve at its other end and is sealingly connected to said inner sleeve in order to close said inner sleeve, wherein said inner sleeve consists of a first sleeve part open at both ends and a second sleeve part aligned with the first sleeve part and closed at one end, its other end abutting upon one end of said first sleeve part, said stopper being sealingly inserted into said first sleeve part at its other end, wherein the plastics of said first sleeve part is transparent or translucent, whereas the plastics of said second sleeve part is not transparent or translucent but otherwise identical or of equal grade with the plastics of said first sleeve part, wherein said first sleeve part and said second sleeve part are bonded together with their abutting ends in a hermetically sealed and puncture-proof manner, and wherein said stopper is formed as a cable duct to sealingly pass through a cable.

14. A housing according to claim 13, wherein said first sleeve part is an extruded part, whereas said second sleeve part is an injection molded part.

15. A housing according to claim 13, wherein said first sleeve part is made of polysulfone.

16. A housing according to claim 13, wherein said second sleeve part is made of polysulfone.

17. A housing according to claim 13, wherein said stopper is made of polysulfone.

18. A housing according to claim 13, wherein said first sleeve part and said second sleeve part are bonded together by ultrasonic plastics welding.

19. A housing according to claim 18, wherein said stopper is joined to said first sleeve part by ultrasonic plastics welding.

20. A housing according to claim 19, wherein said stopper on its outside is formed with flat contact faces.

21. A housing according to claim 13, wherein a receiving groove is provided on the outside of said stopper, an O-ring is positioned within said receiving groove, and said O-ring is sealingly contacting said first sleeve part to seal off said stopper from said first sleeve part.

22. A housing according to claim 13, wherein said stopper has a central duct with a cable positioned therein, an O-ring is positioned surrounding said cable within said duct, said stopper within said duct having an encompassing bearing for said O-ring and an annular protrusion on the outside of said O-ring, and wherein said annular protrusion is permanently deformed towards said cable thereby pressing the O-ring against said cable for sealing said cable with said duct.

23. A housing according to claim 22, wherein said bearing flange is embodied on a support ring inserted into said duct of said stopper.

24. A housing according to claim 13, wherein in the area of said first sleeve part made of transparent or translucent plastics an observation hole is provided in said outer sleeve of metal.

* * * * *